United States Patent
Rozsypal

(10) Patent No.: US 7,417,265 B2
(45) Date of Patent: Aug. 26, 2008

(54) SCHOTTKY DIODE STRUCTURE WITH ENHANCED BREAKDOWN VOLTAGE AND METHOD OF MANUFACTURE

(75) Inventor: Antonin Rozsypal, Roznov P. R. (CZ)

(73) Assignee: Semiconductor Components Industries, L.L.C., Phoenix, AZ (US)

(*) Notice: Subject to any disclaimer, the term of this patent is extended or adjusted under 35 U.S.C. 154(b) by 62 days.

(21) Appl. No.: 11/345,789

(22) Filed: Feb. 3, 2006

(65) Prior Publication Data
US 2007/0181909 A1 Aug. 9, 2007

(51) Int. Cl.
*H01L 29/74* (2006.01)
*H01L 31/111* (2006.01)

(52) U.S. Cl. ................ 257/109; 257/484; 257/E27.051

(58) Field of Classification Search ............... 257/109, 257/484, E27.051
See application file for complete search history.

(56) References Cited

U.S. PATENT DOCUMENTS 7,019,377 B2 * 3/2006 Tsuchiko .................... 257/476

2005/0077590 A1 * 4/2005 Swanson et al. ............ 257/484

OTHER PUBLICATIONS

"Device Electronics For Integrated Circuits", Richard S. Muller and Theodore I. Kamins, John Wiley & Sons, copyright 1977, pp. 95-99.

* cited by examiner

*Primary Examiner*—Phat X Cao
(74) *Attorney, Agent, or Firm*—Kevin B. Jackson

(57) ABSTRACT

In one embodiment, a Schottky diode structure comprises a Schottky barrier layer in contact with a semiconductor material through a Schottky contact opening. A conductive ring is formed adjacent the Schottky contact opening and is separated from the semiconductor material by a thin insulating layer. Another insulating layer is formed overlying the structure, and a contact opening is formed therein. The contact opening is wider than the Schottky contact opening and exposes portions of the conductive ring. A Schottky barrier metal is formed in contact with the semiconductor material through the Schottky contact opening, and is formed in further+contact with the conductive ring.

12 Claims, 2 Drawing Sheets

SCHOTTKY DIODE STRUCTURE WITH ENHANCED BREAKDOWN VOLTAGE AND METHOD OF MANUFACTURE

FIELD OF THE INVENTION

This invention relates generally to electronic devices, and more specifically to semiconductor devices having enhanced performance and methods of manufacturing.

BACKGROUND OF THE INVENTION

Metal-semiconductor barrier devices such Schottky diode devices are widely used. For example, Schottky diodes are often integrated into digital logic circuits as fast switches. Also, discrete Schottky diodes are used as power rectifiers because, among other things, they sustain high currents at lower voltage drops compared to diffused pn-junction diodes. Additionally, Schottky diodes are used as variable capacitors that can be operated efficiently, for example, at microwave frequencies.

The integration of Schottky diodes into integrated circuits is assisted by the fact that many such circuit utilize n-type semiconductor material and aluminum contacts in their manufacture. Aluminum forms a blocking contact with n-type silicon if the n-type doping is sufficiently low enough to prevent tunneling electrons from penetrating the barrier. By way of example, doping less than about $10^{17}$ atoms/cm$^3$ is sufficient to provide a good barrier junction. Also, the barrier height of a Schottky barrier comprised of n-type silicon and aluminum is about 0.70 electron volts (eV), and such devices approximate theoretical device characteristics under forward bias quite well.

However, because of the planar structure of typical Schottky devices used today, the breakdown voltage under reverse bias typically is lower than what is desired. This is because the concentration of electric field lines increases near corners of the devices, which detrimentally impacts the abruptness of the reverse breakdown voltage. In addition, when aluminum is used to form the Schottky barrier contact, aluminum spikes are known to form at the edges of the active region because of an interaction between the aluminum, silicon and oxygen from adjacent passivating layers. The aluminum spikes can cause localized high concentrations of electric field lines, which also degrades reverse breakdown voltage.

One technique that manufacturers have used to counteract the effects described above includes diffused guard rings. One problem with the diffused guard ring approach is that they complicate device processing, and they are not suitable for higher forward voltage devices. It is also known to use extended metal flaps overlying thick dielectric regions to enhance reverse breakdown voltages of devices. However, this approach does not solve the aluminum or metal spiking problem described above, which degrades reverse breakdown voltage.

Accordingly, a need exists for a Schottky diode structure and method of manufacture that improves reverse breakdown voltage performance, that is simple to integrate into existing integrated circuit process flows, and that is cost effective.

DETAILED DESCRIPTION OF THE DRAWINGS

Figure 1:
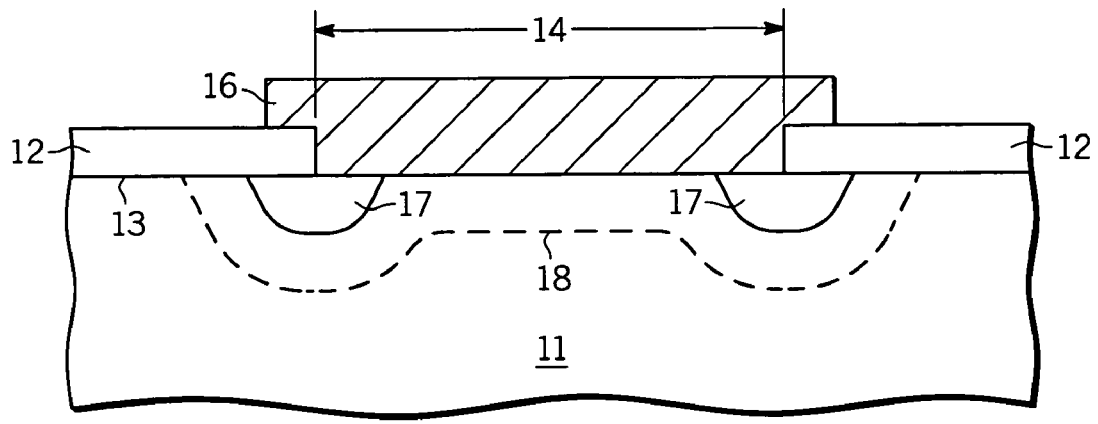
FIG. 1 illustrates a partial cross-sectional view of a prior art Schottky device.

For ease of understanding, elements in the drawing figures are not necessarily drawn to scale, and like element numbers are used where appropriate throughout the various figures to denote the same or similar elements. Although certain conductivity types (e.g., p-type and n-type) are disclosed below, it is understood that the present invention includes and is relevant to those devices where the conductivity types are reversed from those that are specifically described herein.

FIG. 1 shows a highly enlarged cross-sectional view of a prior art Schottky device structure 10. Device 10 includes a substrate 11, which for example comprises an n-type substrate having a dopant concentration less than about $1\times10^{17}$ atoms/cm$^3$. A dielectric layer 12 is formed overlying a major surface 13 of substrate 11, and an opening 14 is formed in dielectric layer 12. A metal layer 16 is formed within opening 14 and forms a Schottky barrier with substrate 11. Device 10 further includes p-type diffused guard ring 17, which is formed adjacent the edges of opening 14.

P-type guard ring 17 forms a pn junction diode with substrate 11, and under reverse bias conditions functions to spread depletion region 18 in such a way that the concentration of electric fields lines at the edges of the device is reduced thereby enhancing the reverse breakdown voltage. Additionally, guard ring 17 is useful in reducing metal spikes in the space charge region. Using guard ring 17 is useful as long as the forward voltage of the Schottky barrier is less than the forward voltage of guard ring 17. This occurs for some metals used to form the Schottky barrier, and when device 10 is operated at low forward currents. However, under higher forward currents, the forward voltage of device 10 increases, and the pn junction diode formed between guard ring 17 and substrate 11 starts to conduct, which detrimentally impacts the performance of device 10.

Figure 2:
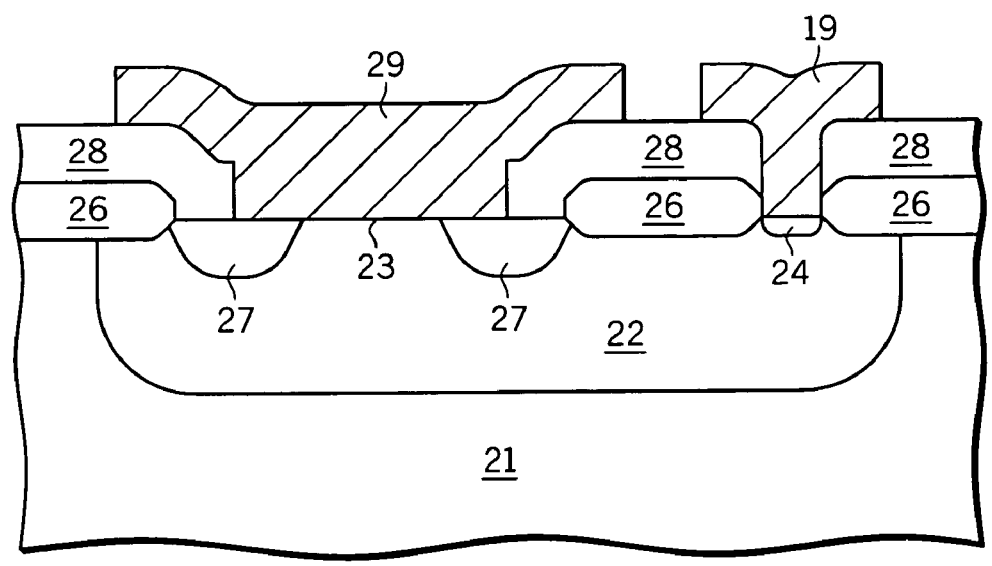
FIG. 2 illustrates a partial cross-sectional view of another prior art Schottky device.

FIG. 2 shows a highly enlarged partial cross-sectional view of a prior art Schottky device 20 implemented in a CMOS process flow. Device 20 comprises a substrate 21 of a first conductivity type, a diffused well region 22 of a second conductivity type opposite that of substrate 21, a guard ring 27 of the first conductivity type, and doped contact region 24 of the second conductivity type. First and second passivation layers 26 and 28 are formed overlying a major surface 23 of device 20, and openings are formed to provide for contacts 29 and 19. Contact 29 forms a Schottky barrier with diffused well region 22, and contact 19 forms a cathode contact through doped contact region 24.

The use of guard ring 27 in a CMOS implementation can provide unacceptable consequences. Specifically, during forward operation the pn junction formed between guard ring 27 and diffused well region 22 causes carrier injection (e.g., hole injection when substrate 21 is p-type, diffused well region 22 is n-type, and guard ring 27 is p-type) in to diffused well region 22, which activates a parasitic bipolar transistor formed between substrate 21, diffused well region 22, and guard ring 27. This parasitic bipolar transistor generates extensive substrate current flow, which detrimentally impacts the performance of the device. Additionally, because guard ring 27 is formed within diffused well region 22, it acts to pinch off the current path between anode contact 29 and cathode contact 19, which further lowers the performance of the device.

Figure 3:
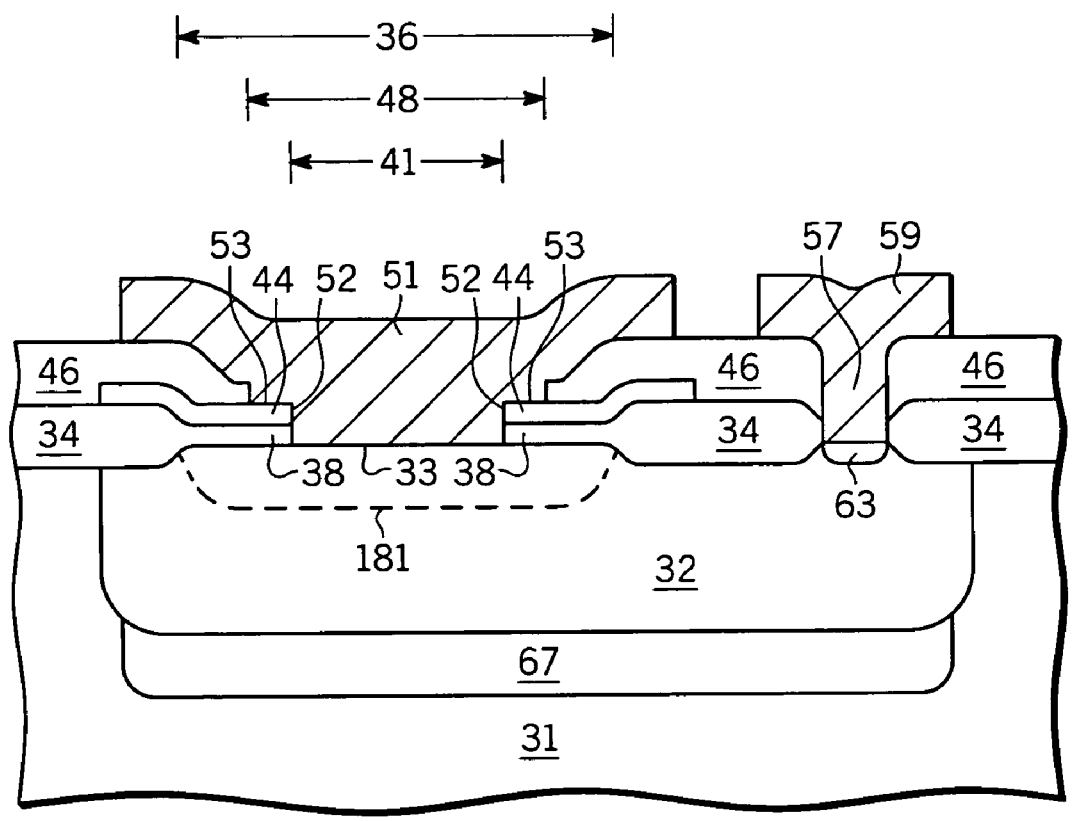
FIG. 3 illustrates a partial cross-section view of an embodiment of a Schottky device in accordance with the present invention.

FIG. 3 shows a highly enlarged partial cross-sectional view of a Schottky diode device, an integrated Schottky barrier device, or a Schottky diode structure 30 with enhanced breakdown voltage in accordance with an embodiment of the present invention. Device 30 is illustrated in an embodiment suitable for a CMOS implementation or a bipolar transistor implementation. However, those skilled in the art will recognize that the present invention is suitable for other Schottky barrier devices such as discrete power Schottky devices.

Device 30 comprises a body of semiconductor material, semiconductor region, or semiconductor substrate 31 of a first conductivity type. By way of example, substrate 31 comprises a p-type semiconductor material, and has a doping concentration on the order of about $1.0 \times 10^{15}$ atoms/cm$^3$. A diffused well region, semiconductor region, region of semiconductor material, or doped semiconductor region 32 is formed with substrate 31 and has a second conductivity type opposite that of substrate 31. By way of example, region 32 has an n-type conductivity, an average doping concentration of about $1.0 \times 10^{16}$ atoms/cm$^3$, and has a junction depth of about 1.5 to about 2.0 microns. In one embodiment, region 32 is a doped n-type region that is formed at the same time as doped n-well regions formed for active MOS devices elsewhere within substrate 31. In another embodiment, region 32 is a doped n-type region that is formed at the same time as doped n-type collector regions formed for active bipolar devices.

A first passivation, passivating or insulating layer 34 is formed overlying a major surface 33 of device 30. By way of example, insulating layer 34 comprises a silicon oxide, and has a thickness of about 0.08 microns to about 2.0 microns. By way of further example, insulating layer 34 is formed using conventional thermal oxidation techniques such a LOCOS formation techniques. Insulating layers 34 are spaced apart or patterned to provide an active area opening 36 as shown, for example, in FIG. 3.

Next, a thin or second passivation, passivating, or insulating layer 38 is formed overlying substrate 31, and subsequently patterned using conventional techniques to provide a Schottky contact opening 41. By way of example, insulating layer 38 comprises a silicon oxide, and has a thickness on the order of about 0.05 microns to about 0.5 microns. In one embodiment, insulating layer 38 is thinner than insulating layer 34. For simplifying the drawing figure, insulating layer 38 is only shown within active opening 36. It is understood that insulating layer 38 may also add to the overall thickness of insulating layer 34. In one embodiment, insulating layer 38 is formed using the same step that forms gate dielectric layers in active MOS transistors formed optionally elsewhere on substrate 31, which simplifies device integration.

A layer of conductive material or conductive polycrystalline semiconductor material is then formed overlying substrate 31, and subsequently patterned using conventional techniques to form a conductive plate or ring, polycrystalline semiconductor conductive plate or ring, or field plate 44 as shown in FIG. 3. In one embodiment, the conductive layer used to form conductive plate 44 and insulating layer 38 are patterned at the same time to provide Schottky contact opening 41. In one embodiment, conductive plate 44 extends from insulating layer 38 onto insulating layer 34 as shown in FIG. 3.

By way of example, conductive plate 44 comprises doped polysilicon, and has a doping concentration greater than about $1.0 \times 10^{18}$ atoms/cm$^3$, and a thickness of about 0.1 micron to about 0.4 micron. In one embodiment, conductive plate 44 is formed at the same time as conductive gate layers in active MOS transistors or as conductive base contact layers in active bipolar devices formed optionally elsewhere on substrate 31, which further simplifies device integration.

A passivating, passivation, or insulating layer 46 is then formed or deposited overlying substrate 31, and subsequently patterned using conventional techniques to provide a contact opening 48. By way of example, insulating layer 46 comprises one or more dielectric materials such a deposited oxide, a deposited nitride, a spin-on glass, or combinations thereof. By way of further example, insulating layer 46 has a thickness of about 0.5 microns to about 1.2 microns. In one embodiment, insulating layer 46 overlaps or overlies portions of conductive plate 44 as shown in FIG. 3.

In accordance with the present invention, opening 48 is wider than or oversized compared to opening 41 so that anode contact layer, Schottky layer, or metal layer 51 makes contact to both vertical 52 and horizontal 53 surfaces of conductive plate 44. This ensures that metal layer 51, which forms a Schottky barrier with well region 32 through opening 41, makes good contact with conductive plate 44 so that conductive plate 44 is biased at the same potential as metal layer 51. This configuration brings the lateral extension of depletion region 181 outside of Schottky contact opening 41, and this coupled with the field shaping effect of conductive plate 44 reduces the concentration of electric field lines at the edges of the Schottky barrier device thereby improving breakdown voltage. By way of example, metal layer 51 comprises aluminum, chromium, refractory metals such as platinum, tungsten, molybdenum, or alloys or combinations thereof, or other metals having appropriate Schottky barriers and adhesion to semiconductor materials. In one embodiment, opening 48 is approximately 2 microns wider than opening 41. In another embodiment, opening 48 is larger than opening 36.

In accordance with the present invention, device 30 avoids the metal spiking problem found in prior art devices because contact opening 48 is outside of Schottky opening 41, and metal layer 51 is separated from major surface 33 by insulating layer 38 and conductive plate 44 at this critical location where the depletion region comes to the surface. Further, device 30 is absent or formed without diffused guard rings so that the pinching effect found in prior art devices (such as with device 20 described above) is avoided. Moreover, since device 30 does not use diffuse guard rings, the forward voltage problem associated with the parallel pn junction diode is avoided.

In the embodiment shown, a contact opening 57 is formed through insulating layers 46 and 34 to provide an opening or via for cathode contact layer or metal layer 59. A doped region 63 of the second conductivity type is formed within opening 57 at major surface 33 to provide ohmic contact. By way of example, doped region 63 has a doping concentration greater than about $1.0 \times 10^{19}$ atoms/cm$^3$.

In an optional embodiment, for example when device 30 is integrated into a bipolar transistor integrated circuit flow, a buried layer 67 of the second conductivity type is formed within semiconductor region 31 and below region 32 to improve series resistance between anode contact 51 and cathode contact 19. In this embodiment, region 32 may comprise an epitaxial layer formed overlying substrate 31.

Thus, it is apparent that there has been provided, in accordance with the present invention, a structure and method for a Schottky barrier device having enhanced breakdown voltage and over-all performance while avoiding the problems noted with prior art Schottky devices. The structure is simple to manufacture and is compatible with both CMOS and bipolar process flows, which makes the structure cost effective.

Although the invention has been described and illustrated with reference to specific embodiments thereof, it is not intended that the invention be limited to these illustrative embodiments. For example, when device 30 is in a vertical configuration, cathode metal layer 51 is formed on a major surface opposite to major surface 33.

What is claimed is:

1. A Schottky diode structure comprising:
   a region of a semiconductor material having a first major surface;
   a first insulating layer formed overlying the first major surface and having an active area opening;
   a second insulating layer formed overlying the first major surface at least within the active area opening, wherein the second insulating layer has a Schottky contact opening that is smaller than the active area opening;
   a conductive plate formed overlying the second insulating layer;
   a third insulating layer formed overlying the conductive plate, wherein the third insulating layer has a contact opening overlying the Schottky contact opening and that is smaller than the active area opening and larger than the Schottky contact opening;
   a metal layer contacting the region of the semiconductor material to form a Schottky barrier, the metal layer further contacting horizontal and vertical surfaces of the conductive plate;
   a cathode contact coupled to the region of the semiconductor material at the first major surface; and
   a doped region of the second conductivity type formed in the region of the semiconductor material adjoining the cathode contact, wherein the structure is formed absent a guard ring structure adjacent the Schottky barrier.

2. The structure of claim 1 further comprising a semiconductor substrate of a first conductivity type, and wherein the region of the semiconductor material is formed within the semiconductor substrate, and wherein the region of the semiconductor material comprises a second conductivity type.

3. The structure of claim 1, wherein the conductive plate comprises a doped polysilicon ring.

4. The structure of claim 1, wherein the metal layer comprises aluminum.

5. The structure of claim 1, wherein the first insulating layer has a thickness from about 0.05 microns to about 0.5 microns.

6. A Schottky barrier structure comprising:
   a semiconductor region of a first conductivity type having a first major surface;
   a first insulating layer formed overlying the first major surface and having an active area opening;
   a second insulating layer formed overlying the first major surface within the active area opening, wherein the second insulating layer has a Schottky contact opening that is smaller than the active area opening;
   a conductive ring formed overlying the second insulating layer;
   a third insulating layer formed overlying the conductive layer, wherein the third insulating layer has a contact opening overlying the Schottky contact opening and that is smaller than the active area opening and larger than the Schottky contact opening;
   a metal layer contacting the semiconductor region through the Schottky contact opening and contacting the conductive ring through the contact opening, wherein the conductive ring is configured to enhance reverse breakdown voltage of the Schottky barrier structure , and wherein the structure is formed absent a guard ring structure adjacent the Schottky barrier; and
   a cathode contact layer coupled to the semiconductor region at the first major surface.

7. The structure of claim 6, wherein the conductive layer comprises doped polysilicon.

8. The structure of claim 6, wherein the first insulating layer has a thickness from about 0.05 microns to about 0.5 microns.

9. The structure of claim 6, wherein the semiconductor region is formed within a semiconductor substrate of a second conductivity type, and wherein the semiconductor region comprises a well region.

10. The structure of claim 9 further comprising a buried layer of the first conductivity type formed adjacent the well region.

11. The structure of claim 6, wherein the contact metal layer contacts horizontal and vertical surfaces of the conductive ring.

12. The structure of claim 6, wherein the metal layer comprises aluminum.

* * * * *

UNITED STATES PATENT AND TRADEMARK OFFICE
CERTIFICATE OF CORRECTION

PATENT NO. : 7,417,265 B2  Page 1 of 1
APPLICATION NO. : 11/345789
DATED : August 26, 2008
INVENTOR(S) : Antonin Rozsypal It is certified that error appears in the above-identified patent and that said Letters Patent is hereby corrected as shown below:

In claim 6, line 13, the word "layer," is replaced with --ring,--.

Signed and Sealed this

First Day of December, 2009

David J. Kappos
*Director of the United States Patent and Trademark Office*

UNITED STATES PATENT AND TRADEMARK OFFICE
CERTIFICATE OF CORRECTION

PATENT NO. : 7,417,265 B2
APPLICATION NO. : 11/345789
DATED : August 26, 2008
INVENTOR(S) : Antonin Rozsypal Page 1 of 1

It is certified that error appears in the above-identified patent and that said Letters Patent is hereby corrected as shown below:

Column 6, In claim 6, line 13, the word "layer," is replaced with --ring,--.

This certificate supersedes the Certificate of Correction issued December 1, 2009.

Signed and Sealed this

Twenty-second Day of December, 2009

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,417,265 B2 |
| APPLICATION NO. | : 11/345789 |
| DATED | : August 26, 2008 |
| INVENTOR(S) | : Antonin Rozsypal |

Page 1 of 1

It is certified that error appears in the above-identified patent and that said Letters Patent is hereby corrected as shown below:

Column 5, In claim 1, line 23, the word "the" is replaced with --a--.

Column 5, In claim 2, line 5, the word "a" is replaced with --the--.

Signed and Sealed this

Thirtieth Day of March, 2010

David J. Kappos
*Director of the United States Patent and Trademark Office*